(12) United States Patent
Shin (10) Patent No.: US 8,278,985 B2
(45) Date of Patent: Oct. 2, 2012

(54) SYNCHRONIZATION CIRCUIT

(75) Inventor: Dong Suk Shin, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 12/983,177

(22) Filed: Dec. 31, 2010

(65) Prior Publication Data

US 2012/0081161 A1  Apr. 5, 2012

(30) Foreign Application Priority Data

Sep. 30, 2010  (KR) .................. 10-2010-0095650

(51) Int. Cl.
  *H03L 7/06*  (2006.01)
(52) U.S. Cl. ........................ 327/158; 327/149
(58) Field of Classification Search ................. None
  See application file for complete search history.

(56) References Cited

U.S. PATENT DOCUMENTS

| | | | | |
|---|---|---|---|---|
| 7,227,809 B2* | 6/2007 | Kwak | ................. | 365/189.15 |
| 7,414,451 B2* | 8/2008 | Lee | ................. | 327/292 |
| 7,859,316 B2* | 12/2010 | Choi | ................. | 327/158 |
| 2002/0084818 A1 | 7/2002 | Cho | | |
| 2007/0090866 A1 | 4/2007 | Park et al. | | |
| 2007/0152680 A1 | 7/2007 | Fujisawa et al. | | |
| 2007/0194821 A1* | 8/2007 | Gomm et al. | ................. | 327/158 |
| 2009/0322390 A1* | 12/2009 | Shim | ................. | 327/158 |
| 2010/0195423 A1* | 8/2010 | Oh | ................. | 365/194 |

FOREIGN PATENT DOCUMENTS

| | | |
|---|---|---|
| JP | 2004103220 | 4/2004 |
| JP | 20070121114 | 5/2007 |
| KR | 1020090060596 A | 6/2009 |
| KR | 1020090060603 A | 6/2009 |

* cited by examiner

*Primary Examiner* — Cassandra Cox
(74) *Attorney, Agent, or Firm* — William Park & Associates Ltd.

(57) ABSTRACT

A synchronization circuit includes a first loop circuit configured to set an initial delay time by using first initial delay information and generate a first delay signal by changing a delay time of a first input signal, a second loop circuit configured to set the initial delay time by using second initial delay information and generate a second delay signal by changing a delay time of a second input signal, a duty cycle correction unit configured to correct a duty cycle of the first delay signal by using the second delay signal, and an initial delay monitoring circuit configured to generate the first initial delay information and the second initial delay information in response to an internal delay signal of the first loop circuit and the first input signal.

13 Claims, 7 Drawing Sheets

SYNCHRONIZATION CIRCUIT

CROSS-REFERENCES TO RELATED APPLICATION

The present application claims priority under 35 U.S.C. §119(a) to Korean application number 10-2010-0095650, filed on Sep. 30, 2010, in the Korean Intellectual Property Office, which is incorporated herein by reference in its entirety.

BACKGROUND

1. Technical Field

The present invention relates to a semiconductor circuit, and more particularly, to a synchronization circuit.

2. Related Art

A semiconductor circuit may include a synchronization circuit such as a delay locked loop (DLL) or a duty cycle corrector (DCC) for delay locking or duty cycle correction.

The delay locked loop is used to solve a problem in that an internal clock utilized in a semiconductor integrated circuit is delayed through a clock buffer and a transmission line to cause a phase difference between the internal clock and an external clock and thus an output data access time is increased.

When the duty cycle of a clock signal is distorted, the duty cycle corrector is used to correct the duty cycle.

As a semiconductor integrated circuit operates at ever increasing speeds, accurate delay locked operation and duty cycle correction is desirable.

SUMMARY

A synchronization circuit capable of quickly performing a delay locked operation and a duty cycle correction operation at the same time is described herein.

In one embodiment of the present invention, a synchronization circuit includes a first loop circuit configured to set an initial delay time by using first initial delay information and generate a first delay signal by changing a delay time of a first input signal, a second loop circuit configured to set the initial delay time by using second initial delay information and generate a second delay signal by changing a delay time of a second input signal, a duty cycle correction unit configured to correct a duty cycle of the first delay signal by using the second delay signal, and an initial delay monitoring circuit configured to generate the first initial delay information and the second initial delay information in response to an internal delay signal of the first loop circuit and the first input signal.

BRIEF DESCRIPTION OF THE DRAWINGS

Features, aspects, and embodiments are described in conjunction with the attached drawings, in which.

DETAILED DESCRIPTION

Hereinafter, a synchronization circuit according to the present invention will be described in detail with reference to the accompanying drawings through exemplary embodiments.

A signal may be active low or active high. An active low signal is at a low voltage state when it is asserted, logic value '1', and at a high voltage state when it is deasserted, or a logic value '0'. An active high signal is at a high voltage state when it is asserted, and at a low voltage state when it is deasserted. "Activated" and "deactivated" may be used for signals in place of "asserted" and "deasserted," respectively.

Figure 1:
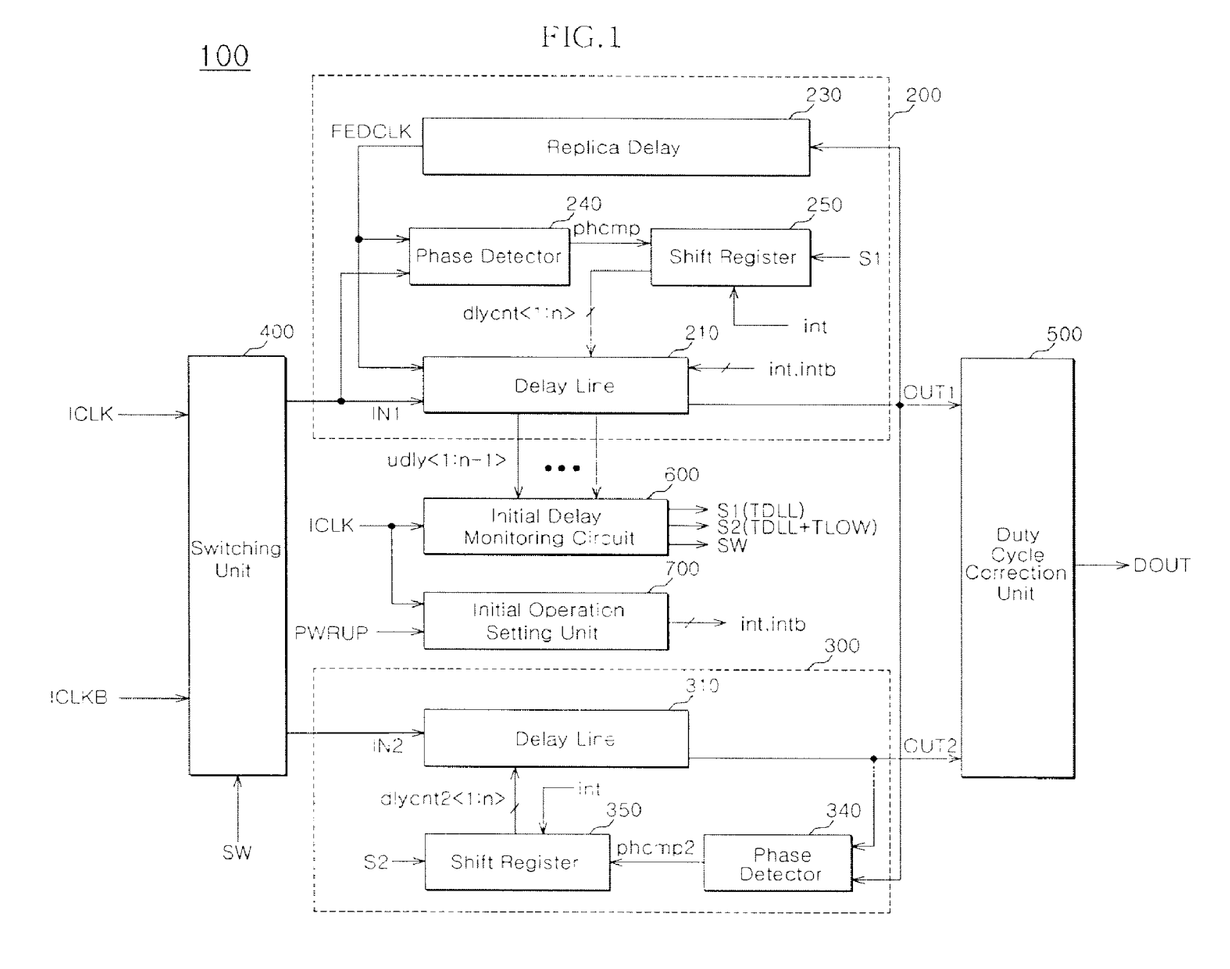
FIG. 1 is a block diagram of a synchronization circuit according to an embodiment of the present invention.

Referring to FIG. 1, a synchronization circuit 100 according to an embodiment of the invention includes a first loop circuit 200, a second loop circuit 300, a switching unit 400, a duty cycle correction unit 500, an initial delay monitoring circuit 600, and an initial operation setting unit 700.

A delay locked loop circuit, that is, the first loop circuit 200 is configured to set an initial delay time by using first initial delay information S1 and then generate a first delay signal OUT1 by changing the delay time of a first input signal IN1.

The first loop circuit 200 includes a delay line 210, a replica delay 230, a phase detector 240, and a shifter register 250.

The delay line 210 is configured to delay the first input signal IN1 or a feedback signal FEDCLK in response to initial operation signals int and intb and delay control signals dlycnt<1:n> and generate a plurality of unit delay signals udly<1:n−1> and a first delay signal OUT1.

The replica delay 230 is configured to have a delay time obtained by modeling a predetermined delay time, that is, a delay time due to delay elements existing on a path through which the first delay signal OUT1 is transmitted to a data output buffer (not shown).

The phase detector 240 is configured to compare a phase of the first input signal IN1 with a phase of the feedback signal FEDCLK and generate a phase comparison signal phcmp.

The shifter register 250 is configured to generate the delay control signals dlycnt<1:n> in response to the initial operation signal int, the phase comparison signal phcmp, and the first initial delay information S1.

A duty cycle correction circuit, that is, the second loop circuit 300 is configured to set an initial delay time by using second initial delay information S2 and change the delay time of a second input signal IN2 to generate a second delay signal OUT2 for correcting the duty cycle of the first delay signal OUT1.

The second loop circuit 300 includes a delay line 310, a phase detector 340, and a shift register 350.

The delay line 310 is configured to delay the second input signal IN2 in response to delay control signals dlycnt2<1:n> and generate a second delay signal OUT2.

The phase detector 340 is configured to compare a phase of the first delay signal OUT1 with a phase of the second delay signal OUT2 and generate a phase comparison signal phcmp2.

The shift register 350 is configured to generate the delay control signals dlycnt2<1:n> in response to the initial operation signals int, the phase comparison signal phcmp2 and the second initial delay information S2.

The switching unit 400 is configured to output a clock signal ICLK or a clock bar signal ICLKB as the first input signal IN1 or the second input signal IN2 in response to a switching control signal SW.

The duty cycle correction unit 500 is configured to correct the duty cycle of the first delay signal OUT1 by using the second delay signal OUT2 and generate an output signal DOUT for which delay locking and duty cycle correction have been performed.

The duty cycle correction unit 500 may include a mixer configured to mix the first delay signal OUT1 and the second delay signal OUT2 at a mixing ratio of 1:1.

The initial delay monitoring circuit 600 is configured to generate the switching control signal SW, the first initial delay information S1 and the second initial delay information S2 in response to internal delay signals (that is, a plurality of unit delay signals udly<1:n−1>) of the first loop circuit 200 and a clock signal ICLK.

The initial delay monitoring circuit 600 is configured to detect a phase difference between the clock signal ICLK and the plurality of unit delay signals udly<1:n−1> to generate the first initial delay information S1, and detect the phase difference between the clock signal ICLK and the plurality of unit delay signals udly<1:n−1> and a low pulse width of the clock signal ICLK to generate the second initial delay information S2.

The first initial delay information S1 allows a delay time TDLL corresponding to the phase difference between the clock signal ICLK and the feedback signal FEDCLK to be set in the delay-line 210.

The second initial delay information S2 allows a delay time TDLL+TLOW corresponding to the total amount of the delay time TDLL and the low pulse width TLOW of the clock signal ICLK to be set in the delay line 310.

The initial operation setting unit 700 is configured to generate the initial operation signals int and intb in response to the clock signal ICLK and an operation start signal, that is, a power up signal PWRUP.

When the power up signal PWRUP is activated, the initial operation setting unit 700 activates the initial operation signal int during a predetermined cycle of the clock signal ICLK. The activation duration of the initial operation signal int should be defined to include a generation time of the feedback signal FEDCLK in an initial operation of the replica delay 230 and a generation time of the first initial delay information S1 by the initial delay monitoring circuit 600. Meanwhile, since the power up signal PWRUP is activated when a semiconductor integrated circuit generally starts to operate, the power up signal PWRUP is utilized as an operation start signal for indicating the start of the operation of the synchronization circuit 100.

When the initial operation signal int is activated, the delay line 210 receives and delays the feedback signal FEDCLK. The delay control signals dlycnt<1:n> outputted from the shift register 250 are initially set as a logic value by which the delay line 210 generates the unit delay signals udly<1:n−1> of (n−1) bits from the feedback signal FEDCLK and generates an $n^{th}$ unit delay signal (that is, the first delay signal OUT1) from the clock signal ICLK. Meanwhile, the remaining unit delay signals udly<1:n−1> are transferred to the initial delay monitoring circuit 600, and the initial delay monitoring circuit 600 compares phases of the (n−1) unit delay signals udly<1:n−1> with the phase of the clock signal ICLK and generates the first initial delay information S1 according to the phase information of the clock signal ICLK and the feedback signal FEDCLK.

In the state in which the initial operation signal int is activated, when the first initial delay information S1 is inputted, the shift register 250 outputs the first initial delay information S1 as the delay control signals dlycnt<1:n>. That is, initial values of the delay control signals dlycnt<1:n> are set as logic values for minimizing the phase difference between clocks according to the initial phase information of the clock signal ICLK and the feedback signal FEDCLK, so that the delay locked loop starts to operate in the state in which the phase difference between the clocks is initially minimized, thereby obtaining the reduction in the time until the locking of the delay locked loop is completed.

When the initial operation signal int is deactivated, the shift register 250 does not receive the first initial delay information S1 and controls the operation of the delay line 210 while changing the predetermined logic values of the delay control signals dlycnt<1:n>. The delay line 210 does not receive the feedback signal FEDCLK and performs an operation for delaying the clock signal ICLK according to the control of the delay control signals dlycnt<1:n>.

Meanwhile, the replica delay 230 is configured to generate the feedback signal FEDCLK by assigning the delay value, which is obtained by modeling the delay due to the delay elements existing on the path through which the first delay signal OUT1 is transmitted to the data output buffer (not shown), to the first delay signal OUT1. The shift register 240 is configured to generate the phase comparison signal phcmp by performing an operation for comparing the phase of the clock signal ICLK with the phase of the feedback signal FEDCLK. The phase detector 240 may be implemented with an edge trigger-type flip-flop circuit.

As described above, the synchronization circuit 100 according to an embodiment of the invention extracts phase difference information between the clock signal ICLK and the feedback signal FEDCLK during the initial operation duration, and the delay line 210 assigns the delay value for minimizing the phase difference between the two clocks, thereby reducing the time required for the delay locked operation.

Figure 2A:
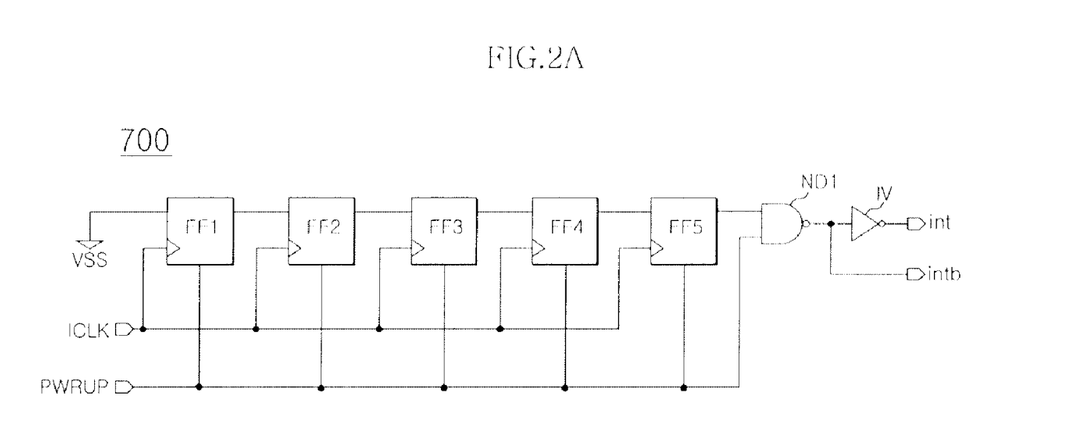
FIG. 2a is a circuit diagram of the initial operation setting unit illustrated in FIG. 1.

As illustrated in FIG. 2a, the initial operation setting unit 700 includes first to fifth flip-flops FF1 to FF5, a NAND gate ND1, and an inverter IV.

The first to fifth flip-flops FF1 to FF5 are serially coupled to one another, output high level signals after being initialized by the power up signal PWRUP, and receive and latch an output signal of a previous stage in response to the clock signal ICLK. The first flip-flop FF1 provided at the first stage receives a ground voltage VSS. The NAND gate ND1 receives an output signal of the fifth flip-flop FF5 and the power up signal PWRUP. The inverter IV receives an output signal of the NAND gate ND1 to output the initial operation signals int and intb.

When the clock signal ICLK is toggled after the power up signal PWRUP is activated, since the fifth flip-flop FF5 outputs the high level signal, the initial operation signal int is activated to a high level. Since the ground voltage VSS is transferred to the NAND gate ND1 after the clock signal ICLK is toggled five times, the initial operation signal int substantially maintains an activation duration during five cycles of the clock signal ICLK.

Figure 2B:
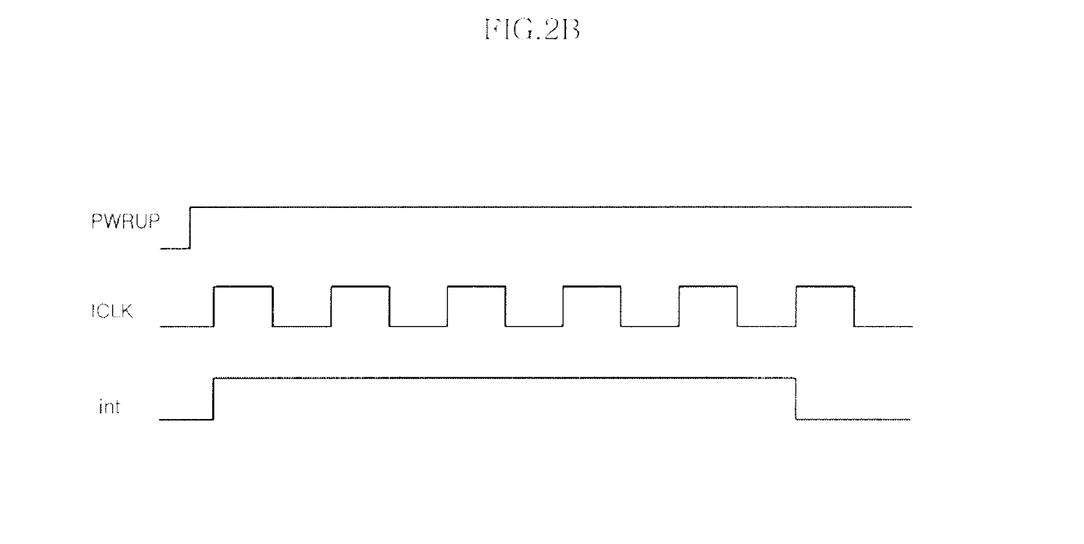
FIG. 2b is a diagram illustrating an operating timing of the initial operation setting unit illustrated in FIG. 2.

Waveforms of the power up signal PWRUP, the clock signal ICLK, and the initial operation signal int as described above can be understood from FIG. 2b.

In an embodiment of the invention, an example in which the initial operation signal int is activated during the five cycles of the clock signal ICLK has been described. However the number of the flip-flops can be increased and decreased according to installation environments and conditions, so that the activation duration of the initial operation signal int can be easily changed. Various embodiments may also have a plurality of flip-flops where some or all of the flip-flops may be selected for use in timing the length of the initial operation signal int.

Figure 3:
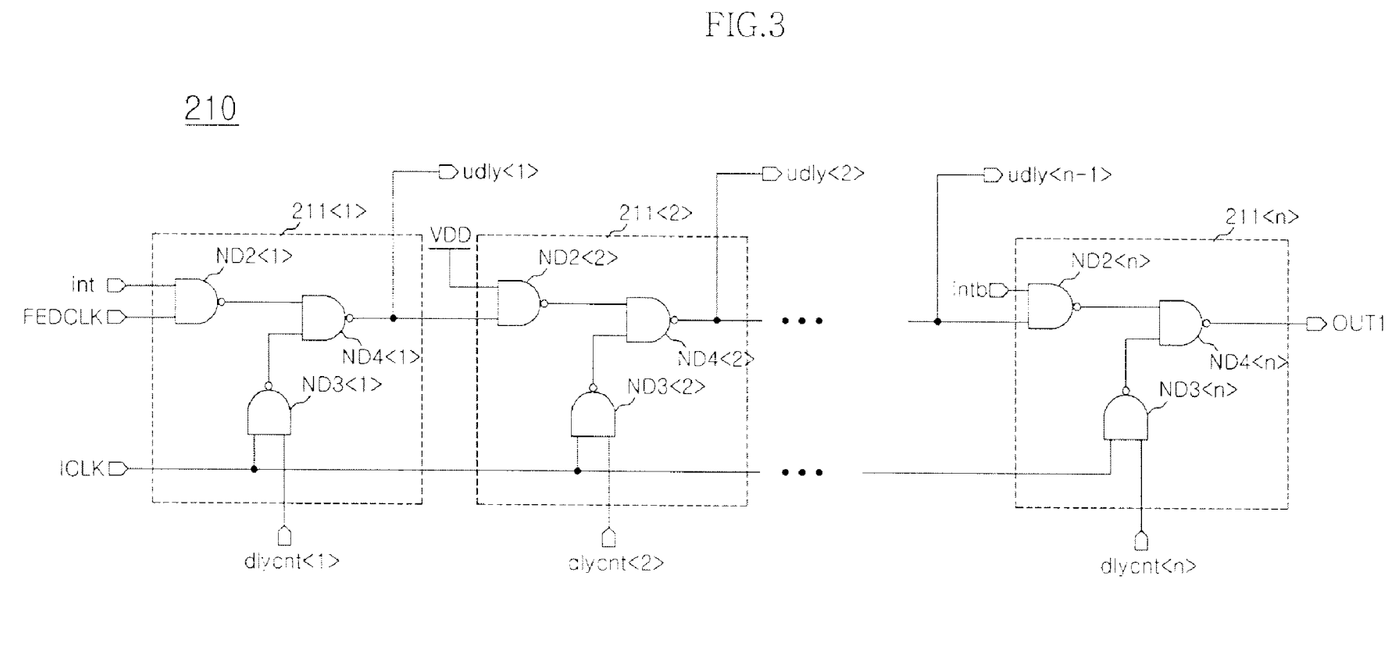
FIG. 3 is a circuit diagram of the delay line illustrated in FIG. 1.

As illustrated in FIG. 3, the delay line 210 includes n unit delay sections 211<1:n> serially coupled to one another.

The unit delay sections 211<1:n> include a plurality of NAND gates ND2<1:n> to ND4<1:n>, respectively. The NAND gate ND2<1> of the unit delay sections 211<1> provided at the first stage receives the initial operation signal int and the feedback signal FEDCLK. The NAND gates ND2<2: n−1> of the second to $(n-1)^{th}$ unit delay sections 211<2:n−1> receive output signals of the unit delay sections 211<1:n−2> of a previous stage and external supply voltage VDD, respectively. The NAND gates ND2<n> of the unit delay section 211<n> provided at the last stage receives the initial operation signal intb and an output signal of the unit delay section 211<n−1> of a previous stage.

The n NAND gates ND3<1:n> provided in the unit delay sections 211<1:n> receive one bit of the delay control signals dlycnt<1:n> and the clock signal ICLK, respectively. The n NAND gates ND4<1:n> receive output signals of the NAND gates ND2<1:n> and output signals of the NAND gates ND3<1:n> and output the plurality of unit delay clocks udly<1:n−1> and the first delay signal OUT1, respectively.

In the delay line 210 configured above, the delay control signals dlycnt<1:n> at the activation time point of the initial operation signal int have been previously set to (0, 0, . . . , 1). The feedback signal FEDCLK is inputted to the NAND gate ND2<1> of the first unit delay section 211<1> and outputted as the (n−1) unit delay signals udly<1:n−1> after being delayed through the (n−1) unit delay section 211<2:n>. At this time, since the output signal of the NAND gate ND2<n> of the $n^{th}$ unit delay section 211<n> is at a high level, the clock signal ICLK is outputted as the first delay signal OUT1 after being delayed by the delay times of the NAND gate ND3<n> and the NAND gate ND4<n> of the $n^{th}$ unit delay section 211<n>.

As described above, in the initial operation, since the delay line 210 assigns the minimum delay time to the clock signal ICLK to generate the first delay signal OUT1 and the feedback signal FEDCLK, the phase of the feedback signal FEDCLK contains specific delay information of the replica delay 230. When generating the (n−1) unit delay signals udly<1:n−1> using the feedback signal FEDCLK at this time, the initial delay monitoring circuit 600 can extract the phase information of the feedback signal FEDCLK generated by the replica delay 230 to compare the extracted phase information with the clock signal ICLK in the initial operation. In order to allow the phase of the clock signal ICLK to approach the phase of the feedback signal FEDCLK, the delay line 210 understands the degree by which the clock signal ICLK is delayed. As a result, it is possible to extract the logic value of the first initial delay information S1, which minimizes the phase difference between the clock signal ICLK and the feedback signal FEDCLK, by the (n−1) unit delay signals udly<1:n−1> outputted from the delay line 210.

When the initial operation signal int is deactivated, the delay line 210 performs an operation for delaying the clock signal ICLK according to the control of the delay control signals dlycnt<1:n> having logic values substantially equal to that of the first initial delay information S1. The delay control signals dlycnt<1:n> may vary depending on the phases of the clock signal ICLK and the feedback signal FEDCLK, but the delay line 210 may complete the delay locked operation in a significantly reduced time as compared with the conventional art.

Figure 4:
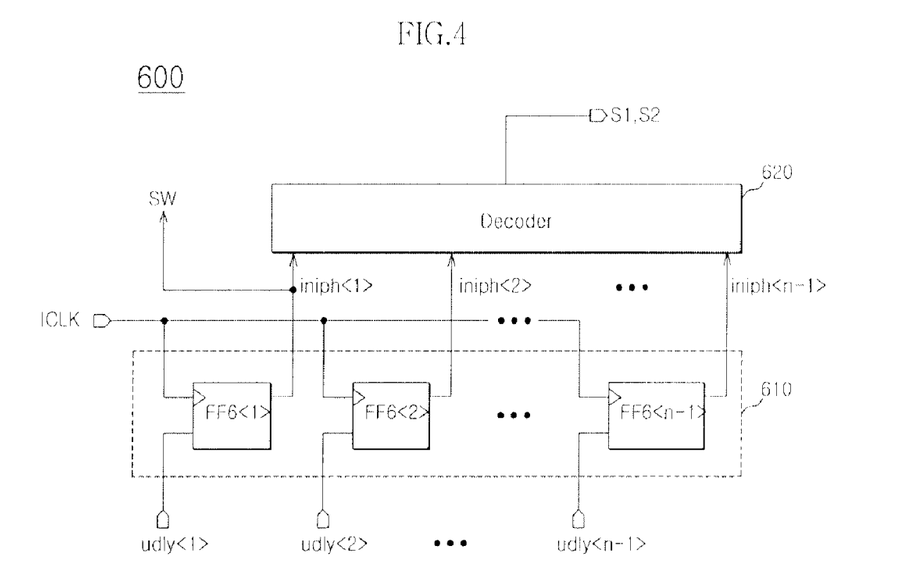
FIG. 4 is a block diagram illustrating the internal configuration of the initial delay monitoring circuit illustrated in FIG. 1.

As illustrated in FIG. 4, the initial delay monitoring circuit 600 includes an initial phase information extraction section 610 configured to compare the phase of the clock signal ICLK with the phases of the unit delay signals udly<1:n−1> of (n−1) bits and generate initial phase signals iniph<1:n−1>, and a decoder 620 configured to decode the initial phase signals iniph<1:n−1> and generate the first initial delay information S1 and the second initial delay information S2.

It is possible to provide the switching unit 400 with the initial phase signal iniph<1> having the most advanced timing of the initial phase signals iniph<1:n−1> as the switching control signal SW.

The initial phase information extraction section 610 includes (n−1) flip-flops FF6<1:n−1> serially coupled to one another, and each of the flip-flops FF6<1:n−1> performs a function of outputting the initial phase signals iniph<1:n−1> by latching the bits of the unit delay signals udly<1:n−1> in response to the clock signal ICLK.

With such a configuration, the initial phase information of the feedback signal FEDCLK and the clock signal ICLK is reflected in logic values of the initial phase signals iniph<1: n−1>.

The decoder 620 is configured to receive the initial phase signals iniph<1:n−1> and generate the first initial delay information S1 and the second initial delay information S2.

The first initial delay information S1 and the second initial delay information S2 may include only one signal having a logic value of '1' at positions different from each other, respectively.

Figure 5:
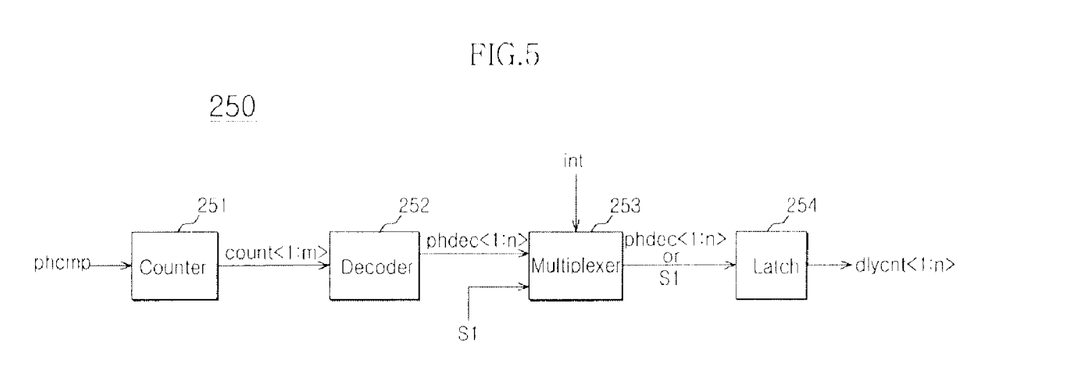
FIG. 5 is a block diagram illustrating the internal configuration of the shift register illustrated in FIG. 1.

As illustrated in FIG. 5, the shift register 250 includes a counter 251 configured to perform a counting operation in response to the phase comparison signal phcmp and output count signals count<1:m> of m bits, a decoder 252 configured to decode the count signals count<1:m> of m bits and output decoding signals phdec<1:n>, a multiplexer 253 configured to selectively output the decoding signals phdec<1:n> or the first initial delay information S1 in response to the initial operation signal int, and a latch section 254 configured to output the delay control signals dlycnt<1:n> by latching an output signal of the multiplexer 253.

The counter 251 increases or decreases the logic values of the count signals count<1:m> of m bits according to the phase information of the clock signal ICLK and the feedback signal FEDCLK which is transferred by the phase comparison signal phcmp. The decoder 252 decodes the count signals count<1:m> of m bits to output the decoding signals phdec<1:n>. The decoding signals phdec<1:n> include only one signal having a logic value of '1' and the logic value of '1' is shifted by one place according to a change in the logic values of the count signals count<1:m> of m bits.

When the initial operation signal int is activated, the multiplexer 253 blocks the decoding signals phdec<1:n> and allows the first initial delay information S1 to pass therethrough. At this time, the logic values of the delay control signals dlycnt<1:n> are set to (0, 0, . . . , 1) in the latch section 254. When the first initial delay information S1 is inputted, the latch section 254 outputs the delay control signals dlycnt<1:n> by latching the first initial delay information S1. That is, during the initial operation duration defined by the initial operation signal int, the first initial delay information S1 is outputted as the delay control signals dlycnt<1:n>. The delay line 210 assigns a delay time for minimizing the phase difference between the clock signal ICLK and the feedback signal FEDCLK to the clock signal ICLK in response to the first initial delay information S1.

When the initial operation signal int is deactivated, the multiplexer 253 blocks the first initial delay information S1 and allows the decoding signals phdec<1:n> to pass therethrough. The latch 254 outputs the delay control signals dlycnt<1:n> by latching the decoding signals phdec<1:n>. At this time, since the phase difference between the clock signal ICLK and the feedback signal FEDCLK is not large, the logic values of the decoding signals phdec<1:n> may approach the logic value of the first initial delay information S1. Accordingly, even if the logic values of the decoding signals phdec<1:n> and the delay control signals dlycnt<1:n> are changed in response to the phase comparison signal phcmp, a short time is required until the logic values of the decoding signals phdec<1:n> are locked, as compared with the conventional art.

Figure 6:
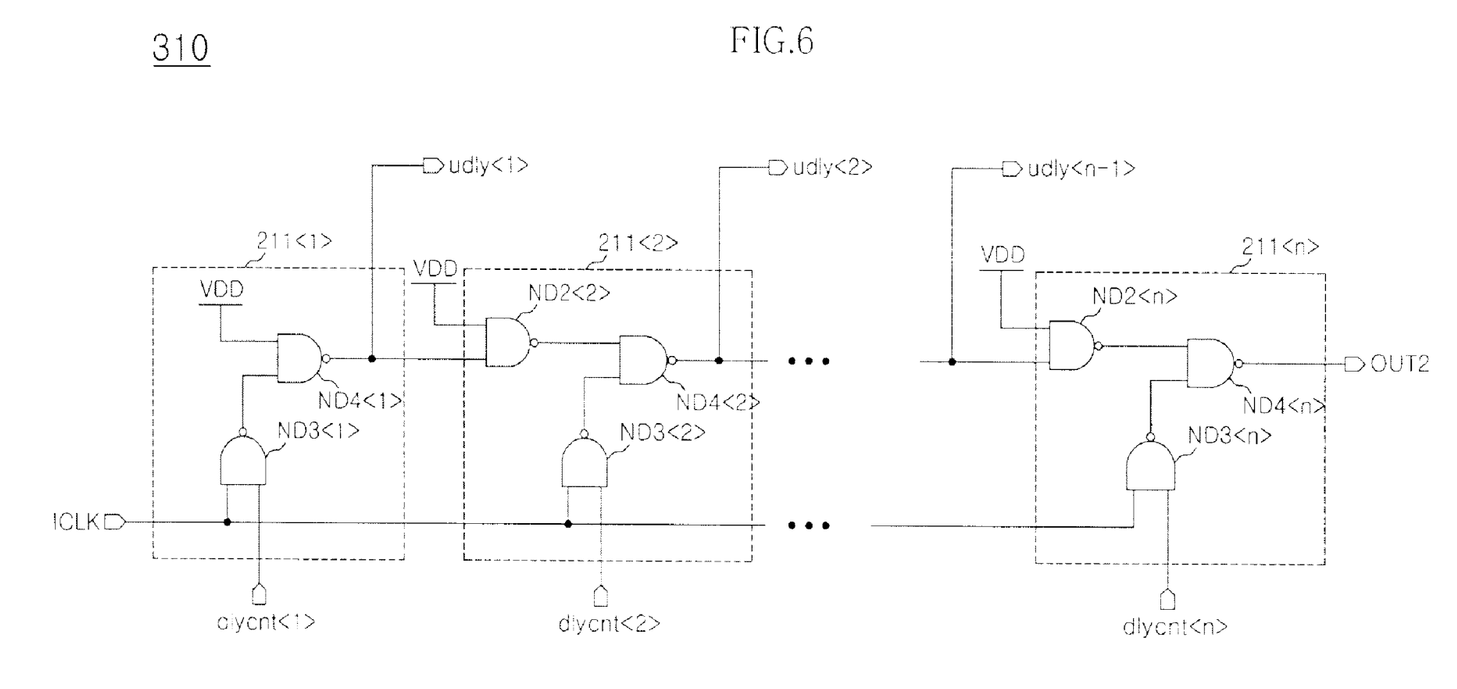
FIG. 6 is a circuit diagram of the delay line illustrated in FIG. 1.

The delay line 310 of the second loop circuit 300, as illustrated in FIG. 6, may have a configuration similar to the delay line 210 (FIG. 3) except that the NAND gate ND2<1> is removed, an external supply voltage VDD is inputted to the NAND gate ND4<1>, and the external supply voltage VDD is inputted to the NAND gate ND2<n> instead of the initial operation signal int.

Figure 7:
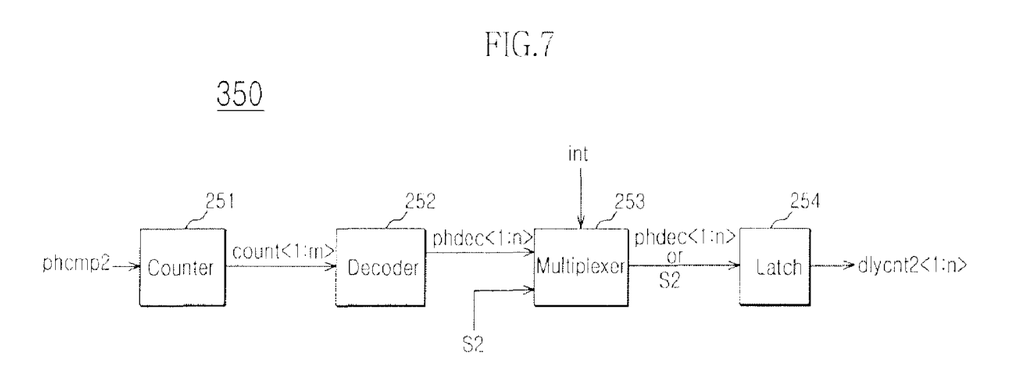
FIG. 7 is a block diagram illustrating the internal configuration of the shift register illustrated in FIG. 1.

As illustrated in FIG. 7, the shift register 350 of the second loop circuit 300 may have a configuration substantially equal to that of the shift register 250 illustrated in FIG. 5, except that the second initial delay information S2 is inputted to the multiplexer 253.

The operation of the synchronization circuit 100 having the above configuration according to the embodiment of the invention will be described with reference to FIGS. 8a and 8b below.

An embodiment of the invention includes the switching unit 400 in order to perform a half-cycle Half tCK operation.

That is, when the delay time TDLL corresponding to the phase difference between the clock signal ICLK and the feedback signal FEDCLK exceeds a half-cycle of the clock signal ICLK, the clock bar signal ICLKB is inputted to the first loop circuit 200 as the first input signal IN1 and the clock signal ICLK is inputted to the second loop circuit 300 as the second input signal IN2.

Accordingly, the first loop circuit 200 operates using the two signals having the phase difference not exceeding the half-cycle of the clock signal ICLK, that is, the clock bar signal ICLKB and the feedback signal FEDCLK.

When the delay time TDLL corresponding to the phase difference between the clock signal ICLK and the feedback signal FEDCLK does not exceed the half-cycle of the clock signal ICLK, the clock signal ICLK is inputted to the first loop circuit 200 as the first input signal IN1 and the clock bar signal ICLKB is inputted to the second loop circuit 300 as the second input signal IN2.

As a signal for controlling the switching unit 400 according to whether the delay time TDLL exceeds the half-cycle of the clock signal ICLK, the switching control signal SW, that is, the initial phase signal iniph<1> may be used.

When the phase difference between the clock signal ICLK and the feedback signal FEDCLK does not exceed the half-cycle of the clock signal ICLK, the initial phase signal iniph<1> is outputted to a high level. That is, the switching control signal SW is at a high level '1'.

When the phase difference between the clock signal ICLK and the feedback signal FEDCLK exceeds the half-cycle of the clock signal ICLK, the initial phase signal iniph<1> is outputted to a low level. That is, the switching control signal SW is at a low level '0'.

The initial delay monitoring circuit 600 illustrated in FIG. 4 generates the first initial delay information S1 and the second initial delay information S2 according to the switching control signal SW which defines whether the delay time TDLL corresponding to the phase difference between the clock signal ICLK and the feedback signal FEDCLK exceeds the half-cycle of the clock signal ICLK.

Figure 8A:
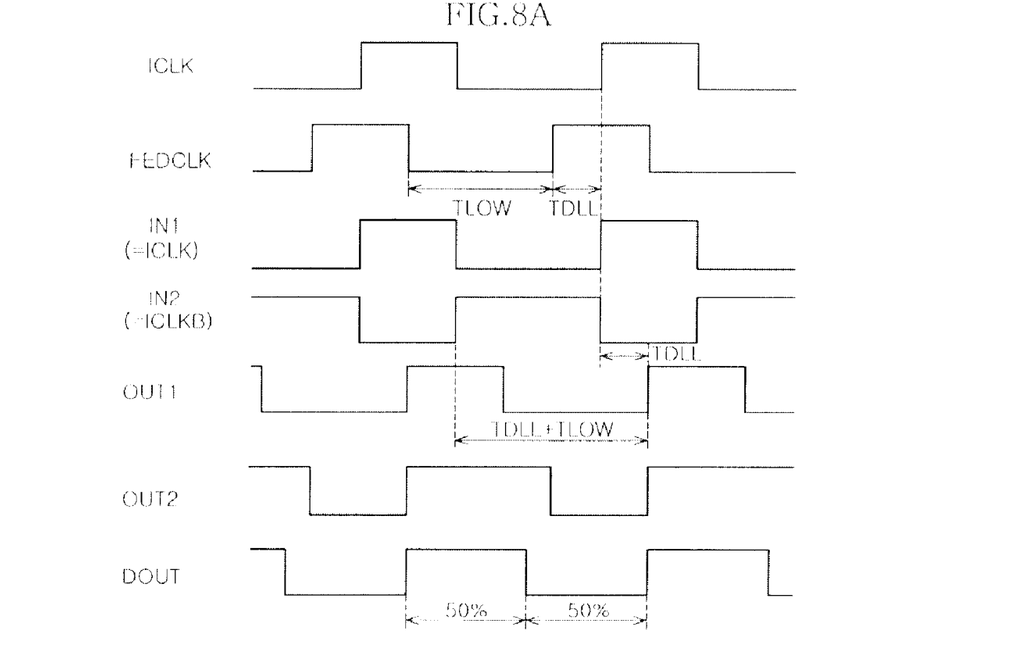
FIGS. 8a and 8b are diagrams illustrating an operating timing of a synchronization circuit according to an embodiment of the present invention.

That is, as illustrated in FIG. 8a, when the phase difference between the clock signal ICLK and the feedback signal FEDCLK does not exceed the half-cycle of the clock signal ICLK, since the initial phase signals iniph<1:n−1> have values of '1, 1, ..., 0, 0, ..., 1, 1, ...' and the initial phase signal iniph<1> is at a high level, the switching control signal SW is outputted to a high level '1'.

The number of bits continuously having a value of '1' in the initial phase signals iniph<1:n−1> defines the delay time TDLL corresponding to the phase difference between the clock signal ICLK and the feedback signal FEDCLK. Accordingly, the decoder 620 illustrated in FIG. 4 generates the first initial delay information S1 with a logic value for setting the delay time of the delay line 210 by the delay time TDLL by using the bits continuously having the value of '1' in the initial phase signals iniph<1:n−1>.

The number of bits continuously having a value of '0' in the initial phase signals iniph<1:n−1> defines the low pulse width TLOW of the clock signal ICLK. At this time, duty cycle correction is performed by mixing the clock bar signal ICLKB delayed by the low pulse width of the clock signal ICLK with the clock signal ICLK. Accordingly, the decoder 620 illustrated in FIG. 4 generates the second initial delay information S2 with a logic value for setting the delay time of the delay line 310 by the delay time TDLL+TLOW by using the bits continuously having the value of '0' in the initial phase signals iniph<1:n−1>.

Thus, the clock signal ICLK is inputted to the first loop circuit 200 as the first input signal IN1 and the clock bar signal ICLKB is inputted to the second loop circuit 300 as the second input signal IN2.

The initial delay time of the delay line 210 of the first loop circuit 200 is set according to the first initial delay information S1.

Then, the first loop circuit 200 performs a delay locked operation through the phase comparison and delay time correction of the first input signal IN1 and the second input signal IN2, thereby generating the first delay signal OUT1.

The initial delay time of the delay line 310 of the second loop circuit 300 is set according to the second initial delay information S2.

Then, the second loop circuit 300 performs a delay locked operation through the phase comparison and delay time correction of the first input signal IN1 and the second input signal IN2, thereby generating the second delay signal OUT2.

The first delay signal OUT1 is obtained by substantially delaying the clock signal ICLK by TDLL and the second delay signal OUT2 is obtained by substantially delaying the clock signal ICLK by TDLL+TLOW.

As mentioned above, the duty cycle correction is performed by mixing the clock bar signal ICLKB delayed by the low pulse width of the clock signal ICLK with the clock signal ICLK.

Consequently, the duty cycle correction unit 500 mixes the first delay signal OUT1 and the second delay signal OUT2 at the mixing ratio of 1:1, thereby generating the output signal DOUT for which the delay locking and duty cycle correction have been performed.

Figure 8B:
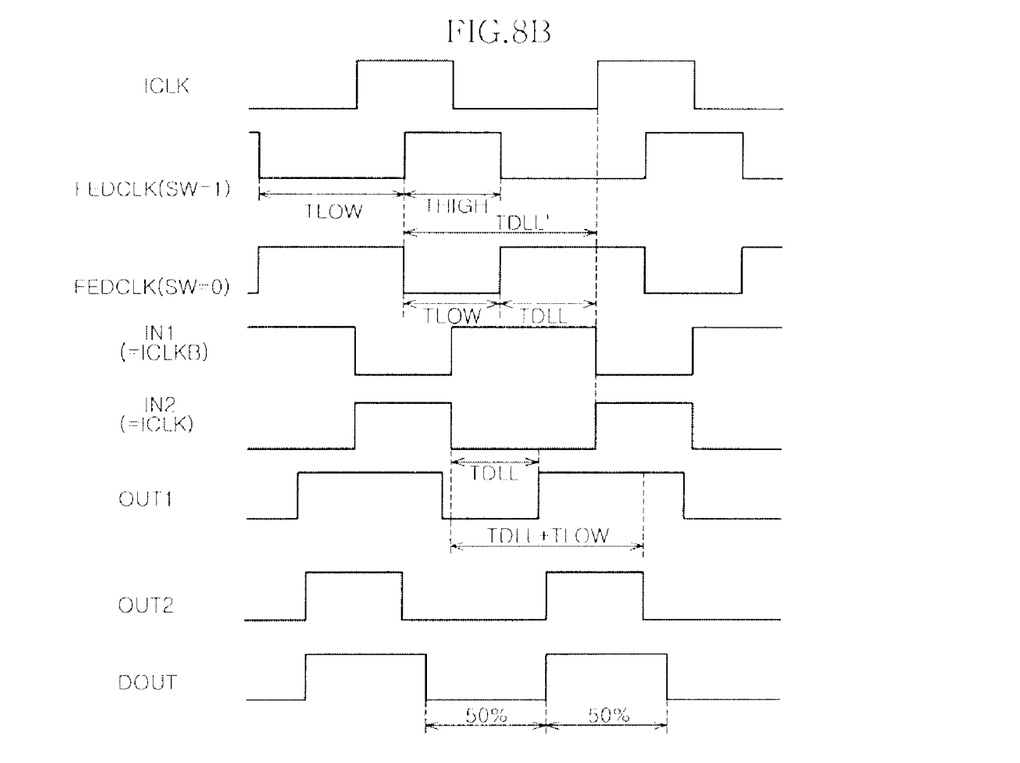

Meanwhile, as illustrated in FIG. 8b, when the phase difference between the clock signal ICLK and the feedback signal FEDCLK exceeds the half-cycle of the clock signal ICLK, since the initial phase signals iniph<1:n−1> have values of '0, 0, ..., 1, 1, ..., 0, 0, ...' and the initial phase signal iniph<1> is at a low level, the switching control signal SW is outputted to a low level '0'.

Since the switching control signal SW is at a low level '0', after setting the initial delay information S1 and S2, the clock bar signal ICLKB is inputted to the first loop circuit 200 as the first input signal IN1 and the clock signal ICLK is inputted to the second loop circuit 300 as the second input signal IN2.

That is, the clock bar signal ICLKB is controlled according to the first initial delay information S1.

Accordingly, as illustrated in FIG. 8b, the feedback signal FEDCLK used to generate the first initial delay information S1 and the second initial delay information S2, that is, THIGH of the feedback signal FEDCLK when the switching control signal SW is at a high level '1' corresponds to TLOW which is to be actually obtained, and TDLL'-THIGH corresponds to TDLL which is to be actually obtained.

The number of bits continuously having a value of '0' in the initial phase signals iniph<1:n−1> defines the delay time TDLL corresponding to the phase difference between the clock signal ICLK and the feedback signal FEDCLK. Accordingly, the decoder 620 illustrated in FIG. 4 generates the first initial delay information S1 with a logic value for setting the delay time of the delay line 210 by the delay time TDLL by using the bits continuously having the value of '0' in the initial phase signals iniph<1:n−1>.

The number of bits continuously having a value of '1' in the initial phase signals iniph<1:n−1> defines the low pulse width TLOW of the clock signal ICLK. At this time, duty cycle correction is performed by mixing the clock bar signal ICLKB delayed by the low pulse width of the clock signal ICLK with the clock signal ICLK. Accordingly, the decoder 620 illustrated in FIG. 4 generates the second initial delay information S2 with a logic value for setting the delay time of the delay line 310 by the delay time TDLL+TLOW by using the bits continuously having the value of '1' in the initial phase signals iniph<1:n−1>.

As described above, after the first initial delay information S1 and the second initial delay information S2 are generated, the clock bar signal ICLKB is inputted to the first loop circuit 200 as the first input signal IN1 and the clock signal ICLK is inputted to the second loop circuit 300 as the second input signal IN2 according to the switching control signal SW at a low level.

Then, the first delay signal OUT1 and the second delay signal OUT2 are generated by the operation of the first loop circuit 200 and the second loop circuit 300, and the duty cycle correction unit 500 generates the output signal DOUT for which the delay locking and duty cycle correction have been performed.

According to an embodiment of the invention, the initial delay information can be generated using the initial delay monitoring circuit, so that the duty cycle correction can be quickly performed as well as the delay locking.

Furthermore, according to an embodiment of the invention, the initial delay monitoring circuit and the delay locked loop share the delay line, so that the accuracy of the initial delay information can be improved.

In addition, according to an embodiment of the invention, the clock signal ICLK and the clock bar signal ICLKB are selectively inputted to the first loop circuit 200 and the second loop circuit 300 according to the phase difference between the clock signal ICLK and the feedback signal FEDCLK, so that the half-cycle Half tCK operation can be performed.

While certain embodiments have been described above, it will be understood to those skilled in the art that the embodiments described are by way of example only. Accordingly, the synchronization circuit described herein should not be limited based on the described embodiments. Rather, the synchronization circuit described herein should only be limited in light of the claims that follow when taken in conjunction with the above description and accompanying drawings.

What is claimed is:

1. A synchronization circuit comprising:
   a first loop circuit configured to set an initial delay time of the first loop circuit by using first initial delay information and generate a first delay signal by changing a delay time of a first input signal;
   a second loop circuit configured to set an initial delay time of the second loop circuit by using a second initial delay information and generate a second delay signal by changing a delay time of a second input signal;
   a duty cycle correction unit configured to correct a duty cycle of the first delay signal by using the second delay signal; and
   an initial delay monitoring circuit configured to generate the first initial delay information and the second initial delay information in response to an internal delay signal of the first loop circuit and a clock signal
   wherein the first input signal includes the clock signal.

2. The synchronization circuit according to claim 1, further comprising:
   an initial operation setting unit which is configured to generate an initial operation signal in response to the first input signal and an operation start signal.

3. The synchronization circuit according to claim 2, wherein the initial operation setting unit is configured to activate the initial operation signal during a predetermined cycle of the first input signal when the operation start signal is activated.

4. The synchronization circuit according to claim 2, wherein the first loop circuit comprises:
   a delay line configured to delay one of the first input signal and a feedback signal in response to the initial operation signal and a delay control signal and generate the internal delay signal and the first delay signal;
   a replica delay configured to generate the feedback signal by delaying the first delay signal for a predetermined time;
   a phase detector configured to compare a phase of the first input signal with a phase of the feedback signal and generate a phase comparison signal; and
   a shifter register configured to generate the delay control signal in response to the initial operation signal, the phase comparison signal, and the first initial delay information.

5. The synchronization circuit according to claim 4, wherein the delay line is configured to generate the internal delay signal by delaying the feedback signal when the initial operation signal is activated.

6. The synchronization circuit according to claim 4, wherein the shifter register is configured to generate the delay control signal by using the first initial delay information when the initial operation signal is activated.

7. The synchronization circuit according to claim 4, wherein the shifter register comprises:

a counter configured to generate a count signal by performing a counting operation in response to the phase comparison signal;

a decoder configured to generate a decoding signal by decoding the count signal;

a multiplexer configured to selectively output one of the decoding signal and the first initial delay information in response to the initial operation signal; and a latch configured to output the delay control signal by latching an output signal of the multiplexer.

8. The synchronization circuit according to claim 1, wherein the duty cycle correction unit comprises:

a mixer configured to mix the first delay signal with the second delay signal.

9. The synchronization circuit according to claim 1, wherein the initial delay monitoring circuit is configured to generate the first initial delay information by detecting a phase difference between the first input signal and the internal delay signal, and generate the second initial delay information by detecting the phase difference between the first input signal and the internal delay signal and a low pulse width of the first input signal.

10. The synchronization circuit according to claim 1, wherein the initial delay monitoring circuit comprises:

an initial phase information extraction section configured to compare a phase of the first input signal with a phase of the internal delay signal and generate an initial phase signal; and a decoder configured to decode the initial phase signal and generate the first initial delay information and the second initial delay information.

11. The synchronization circuit according to claim 2, wherein the second loop circuit comprises:

a delay line configured to delay the second input signal in response to a delay control signal and generate the second delay signal;

a phase detector configured to compare a phase of the first delay signal with a phase of the second delay signal and generate a phase comparison signal; and a shift register configured to generate the delay control signal in response to the initial operation signal, the phase comparison signal, and the second initial delay information.

12. The synchronization circuit according to claim 1, further comprising:

a switching unit configured to output the clock signal as the first input signal or a clock bar signal as the second input signal, in response to a switching control signal.

13. The synchronization circuit according to claim 12, wherein the initial delay monitoring circuit comprises:

an initial phase information extraction section configured to compare a phase of the clock signal with a phase of the internal delay signal to generate an initial phase signal, and output one bit of the initial phase signal as the switching control signal; and a decoder configured to decode the initial phase signal and generate the first initial delay information and the second initial delay information.

* * * * *